(12) United States Patent
Chung

(10) Patent No.: US 7,050,297 B2
(45) Date of Patent: May 23, 2006

(54) CARRIER FOR A PERIPHERAL DEVICE RACK

(75) Inventor: Cheng Kuang Chung, Tu-Chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 3 days.

(21) Appl. No.: 10/445,112

(22) Filed: May 23, 2003

(65) Prior Publication Data

US 2004/0190266 A1   Sep. 30, 2004

(30) Foreign Application Priority Data

Mar. 28, 2003   (TW) ............................... 92204911 U

(51) Int. Cl.
*G06F 1/16* (2006.01)

(52) U.S. Cl. .................. 361/685; 361/725; 312/223.1; 312/223.2

(58) Field of Classification Search ................ 361/683, 361/685, 724–727; 312/223.1, 223.2, 333; 369/75.1, 79; 206/701, 706, 707
See application file for complete search history.

(56) References Cited

U.S. PATENT DOCUMENTS

| | | | |
|---|---|---|---|
| 6,288,902 B1 * | 9/2001 | Kim et al. .................. 361/725 |
| 6,431,718 B1 * | 8/2002 | Gamble et al. ................ 362/85 |
| 6,560,098 B1 * | 5/2003 | Beinor et al. ................ 361/685 |
| 6,603,657 B1 * | 8/2003 | Tanzer et al. ................ 361/685 |
| 2002/0017838 A1 * | 2/2002 | Roesner et al. .......... 312/223.1 |

FOREIGN PATENT DOCUMENTS

TW    467354    12/2001

* cited by examiner

*Primary Examiner*—Michael Datskovskiy
*Assistant Examiner*—Anthony Q. Edwards
(74) *Attorney, Agent, or Firm*—Wei Te Chung

(57) ABSTRACT

A carrier includes a drive bracket (30), a bezel (20), and a lever (10). The drive bracket includes a front plate (32) and a side plate (34). A first opening (322) and a second opening (342) are respectively defined in the front plate and the side plate. The bezel defines an aperture (24) corresponding to the first opening of the drive bracket. The lever includes a main body (16) and a handle (12). Two stop tabs (142) project from the handle. The main body has an end portion (162). When the drive bracket is slid into a rack (70), the stop tabs abut a front frame (76) of the rack thereby preventing the carrier from being over-inserted into the rack. Then when the handle is pressed, the end portion extends through the second opening of the drive bracket to engage with the rack thereby securing the carrier to the rack.

12 Claims, 8 Drawing Sheets

CARRIER FOR A PERIPHERAL DEVICE RACK

BACKGROUND OF THE INVENTION

1. Field of the Invention

The present invention relates to computer equipment enclosures, and particularly to a carrier for a peripheral device rack.

2. Prior Art

Many computer systems, including personal computers, workstations, servers and embedded systems are designed to have multiple peripheral devices included therein. A typical personal computer system includes a processor, associated memory and control logic, and a number of peripheral devices that provide input and output (I/O) for the system. Such peripheral devices include, for example, compact disk read-only memory (CD-ROM) drives, hard disk drives, and floppy disk drives. Additionally, computer systems often have capability to interface with external enclosures that include additional peripheral devices.

For many applications, it is desirable to include a maximum possible number of peripheral devices enclosed in a chassis of a computer system. For example, a large number of hard disk drives can enhance the system's external memory capability. An example of this type of computer system is disclosed in Taiwan Pat. No. 467354. As shown in FIGS. 6–8, a carrier 50 comprises a handle 60 at the front thereof. The handle 60 comprises an end portion 62. To install the carrier 50 in a peripheral device rack 80, the handle 60 is pushed in a first direction, and the end portion 62 is thus extended through an opening 84 of the peripheral device rack 80. However, when the carrier 50 is slid into the rack, it is substantially obscured by a front frame 86 of the rack 80. The user is unable to easily ascertain whether the carrier 50 has reached a correct installed position. As a result, the carrier 50 may be over-inserted into the rack 80. When this happens, the carrier 50 may become stuck in the rack 80. In addition, the carrier 50 or the rack 80 may be damaged. In particular, electrical terminals inside the rack 80 may be damaged by the leading end of the carrier 50.

Thus an improved carrier which overcomes the above-mentioned problems is desired.

SUMMARY OF THE INVENTION

Accordingly, an object of the present invention is to provide a carrier which allows convenient installation and removal of a peripheral device into and from a peripheral device rack.

To achieve the above-mentioned object, a carrier for a peripheral device rack in accordance with a preferred embodiment of the present invention includes a drive bracket, a bezel and a lever. The drive bracket includes a front plate and a side plate. A first opening and a second opening are respectively defined in said front plate and side plate. The bezel defines an aperture corresponding to the first opening of the drive bracket. The lever includes a main body and a handle. A pair of stop tabs projects from said handle. The main body comprises an end portion. When the drive bracket is slid into a rack, the stop tabs of the lever abut a front frame of the rack thereby preventing the carrier from being over-inserted into the rack. Then when the handle is pressed, the end portion extends through the second opening of the drive bracket to engage with the rack, thereby securing the carrier to the rack.

Other objects, advantages and novel features of the present invention will be drawn from the following detailed description of the preferred embodiment of the present invention with the attached drawings, in which:

DESCRIPTION OF THE PREFERRED EMBODIMENT

The present invention will be described in its preferred embodiment, and in conjunction with a peripheral device such as a hard disk drive (HDD) (not shown).

Figure 1:
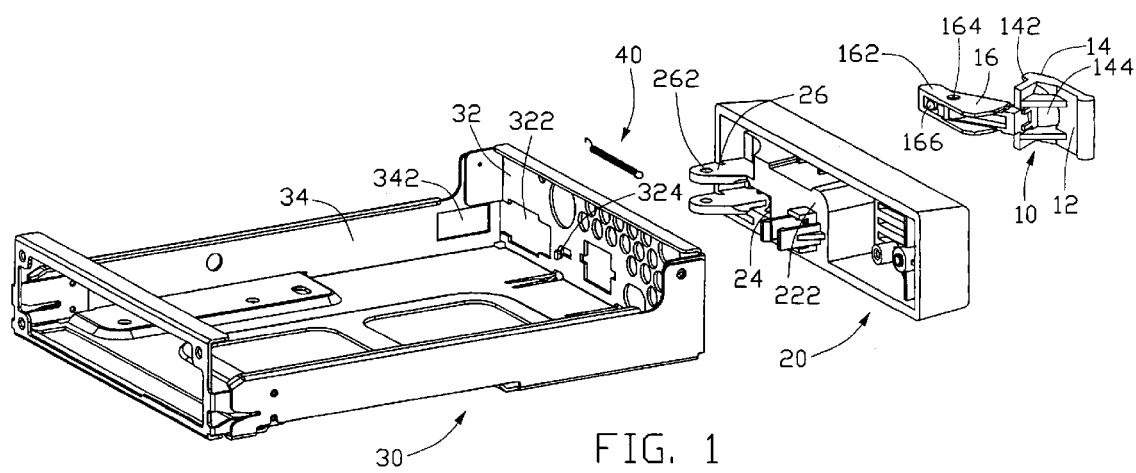
FIG. 1 is an exploded, isometric view of a carrier in accordance with the preferred embodiment of the present invention, the carrier comprising a drive bracket, a bezel and a lever.
Figure 2:
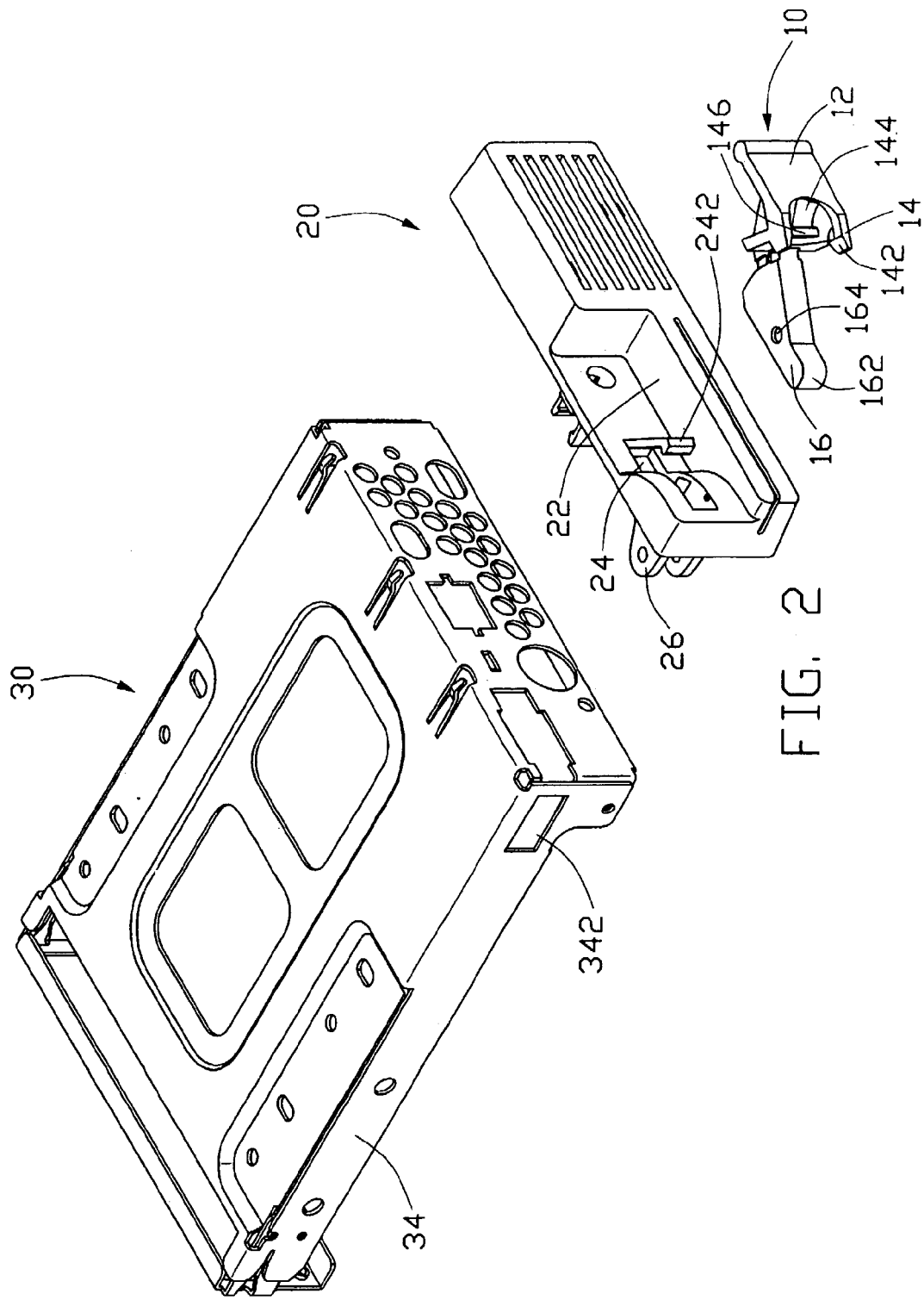
FIG. 2 is similar to FIG. 1, but viewed from another aspect.
Figure 3:
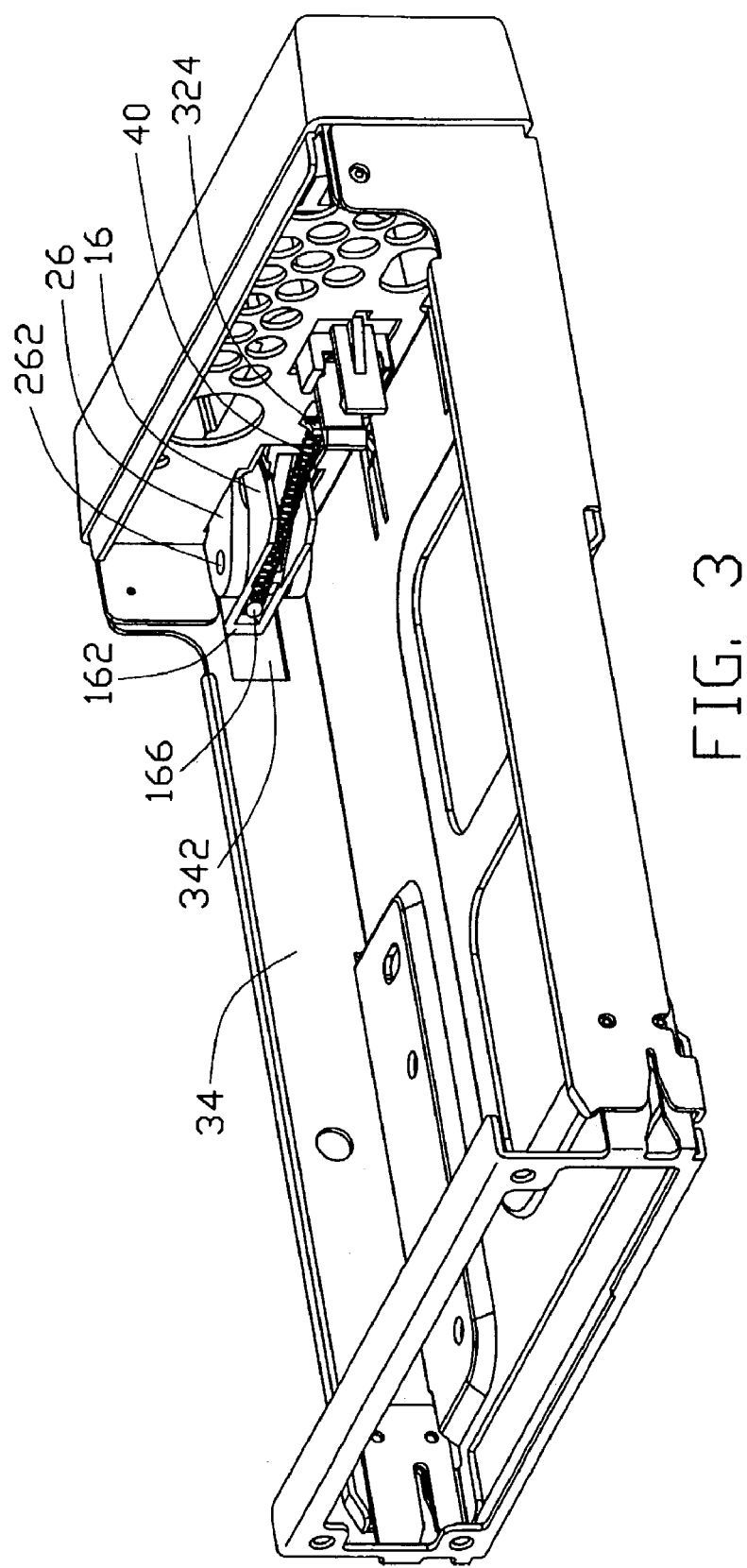
FIG. 3 is an assembled view of FIG. 1.

FIGS. 1, 2 and 3 show a carrier for a peripheral device rack in accordance with a preferred embodiment of the present invention. The carrier is for retaining the HDD therein.

The carrier includes a drive bracket 30, a bezel 20 installed at a front face of the drive bracket 30, a lever 10 pivotably attached to the bezel 20, and a spring 40 attached between the bezel 20 and the lever 10.

The drive bracket 30 is for receiving the HDD therein, and comprises a front plate 32 and an adjacent side plate 34. A first opening 322 and an adjacent second opening 342 are respectively defined in the front plate 32 and side plate 34. A catch tongue 324 is stamped inwardly from the front plate 32, adjacent the first opening 322 and distal from the second opening 342.

The bezel 20 defines a large recess 22 in a front thereof. The recess 22 is bounded in part by a main inner side 222. An elongate aperture 24 is defined through the recess 22, for extension of the lever 10 therein. A slanted locking arm 242 extends outwardly from an edge of the main inner side 222 at an end of the aperture 24. A pair of parallel ears 26 extends rearwardly from the main inner side 222, respectively at upper and lower sides of the aperture 24. Each ear 26 defines a first pivot hole 262 therein.

The lever 10 comprises a main body 16 and a handle 12. The main body 16 comprises an end portion 162. A second pivot hole 164 is defined in the end portion 162, corresponding to the first pivot holes 262 of the bezel 20. A protrusion 166 is formed inside the end portion 162. The handle 12 comprises a top portion 14, and a pair of stop tabs 142 projecting from the top portion 14. A through hole 144 is defined in the top portion 14. A catch bar 146 is formed in the through hole 144, for engaging with the locking arm 242 of the bezel 20.

In assembly of the carrier, the bezel 20 is attached to the front plate 32 of the drive bracket 30 by conventional means. The ears 26 of the bezel 20 extend through the first opening 322 of the front plate 32. The main body 16 of the lever 10 is extended through the aperture 24 of the bezel 20 and sandwiched between the ears 26. The first pivot holes 262 of the ears 26 are aligned with the second pivot hole 164 of the lever 10, and a pivot pin (not shown) is extended through the first and second pivot holes 262, 164 to pivotably attach the lever 10 to the bezel 20. The spring 40 is then attached between the catch tongue 324 of the drive bracket 30 and the protrusion 166 of the lever 10. Thus the drive bracket 30, the bezel 20, the lever 10 and the spring 40 are attached together. The lever 10 is pivotably movable in the first opening 322 of the front plate 32 of the drive bracket 30, and the end portion 162 of the lever 10 is pivotably movable in the second opening 342 of the side plate 34.

Figure 4:
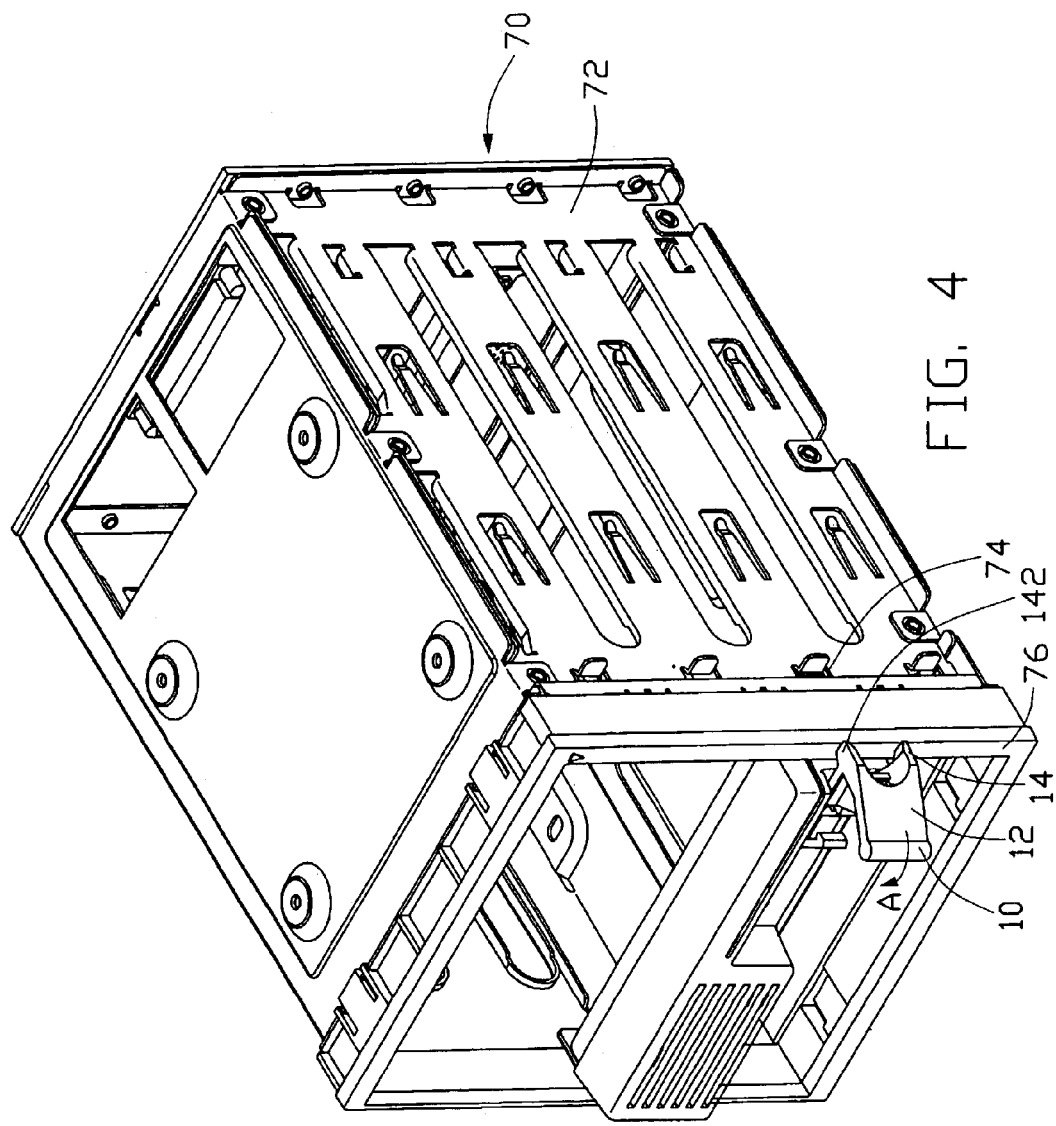
FIG. 4 is an isometric view of the carrier of FIG. 1 received in a rack, showing the lever of the carrier abutting a front frame of the rack.
Figure 5:
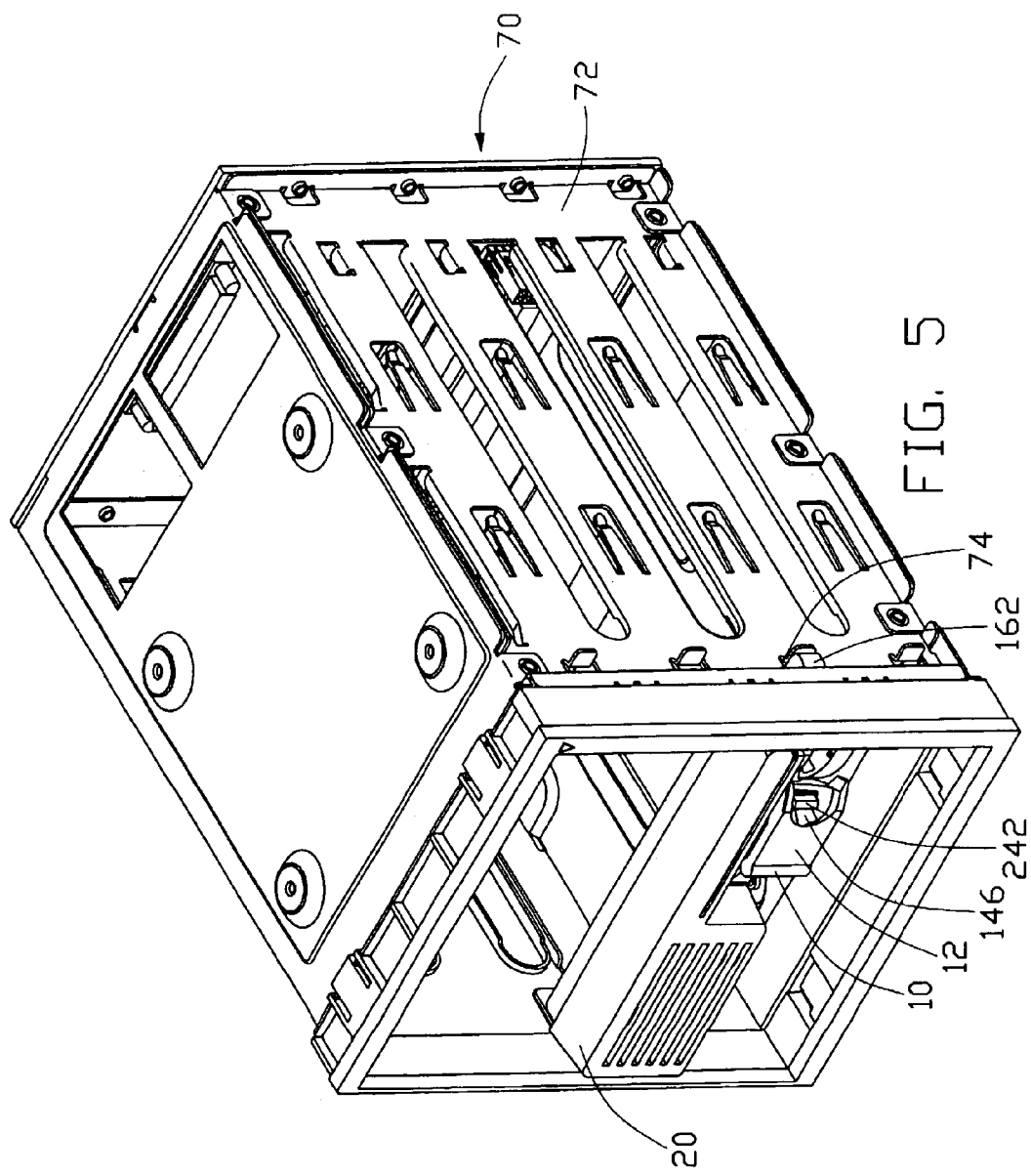
FIG. 5 is similar to FIG. 4, but showing the lever pressed inward, and an end portion of the lever securely engaged in an opening of the rack.
Figure 6:
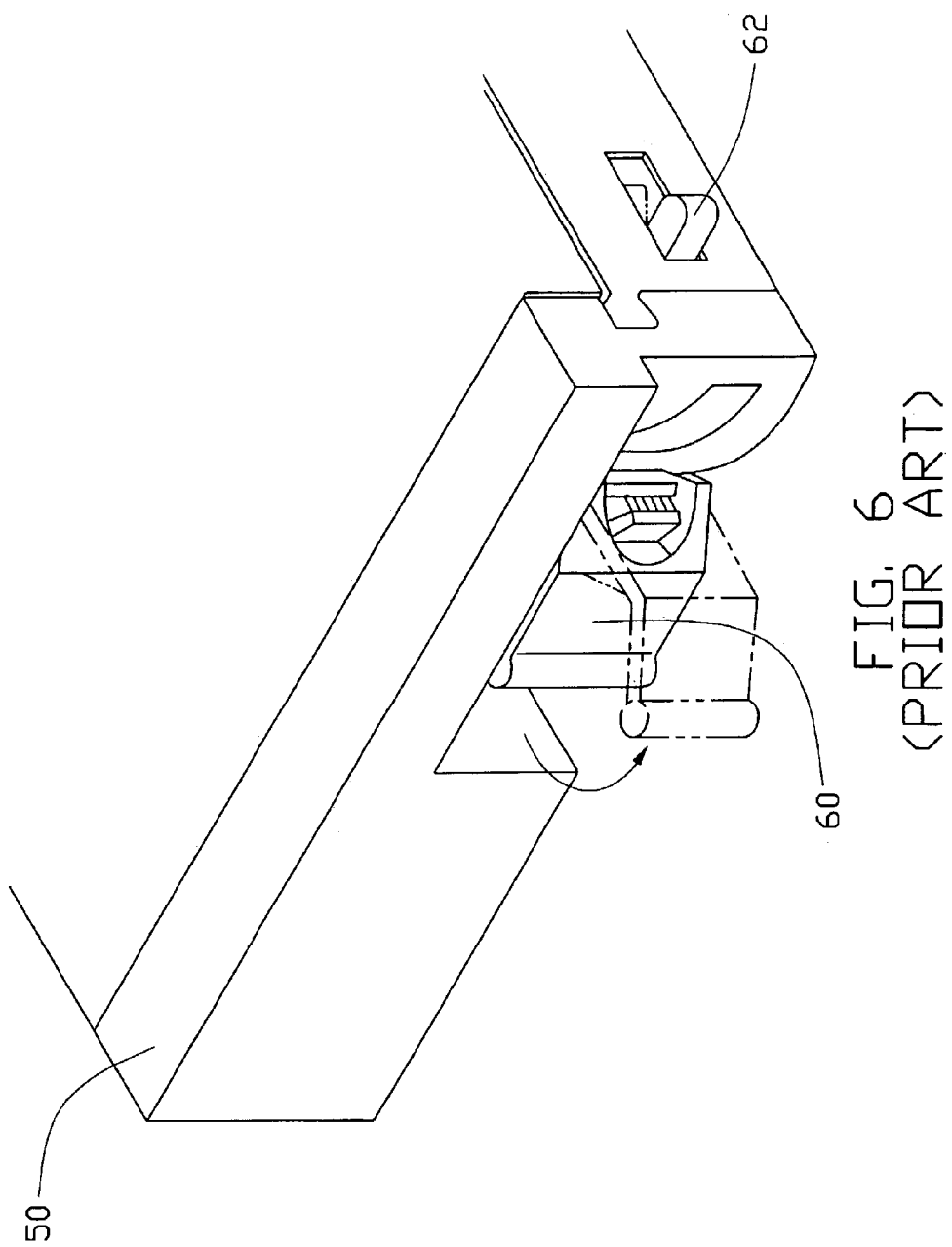
FIG. 6 is an isometric view of a conventional carrier.
Figure 7:
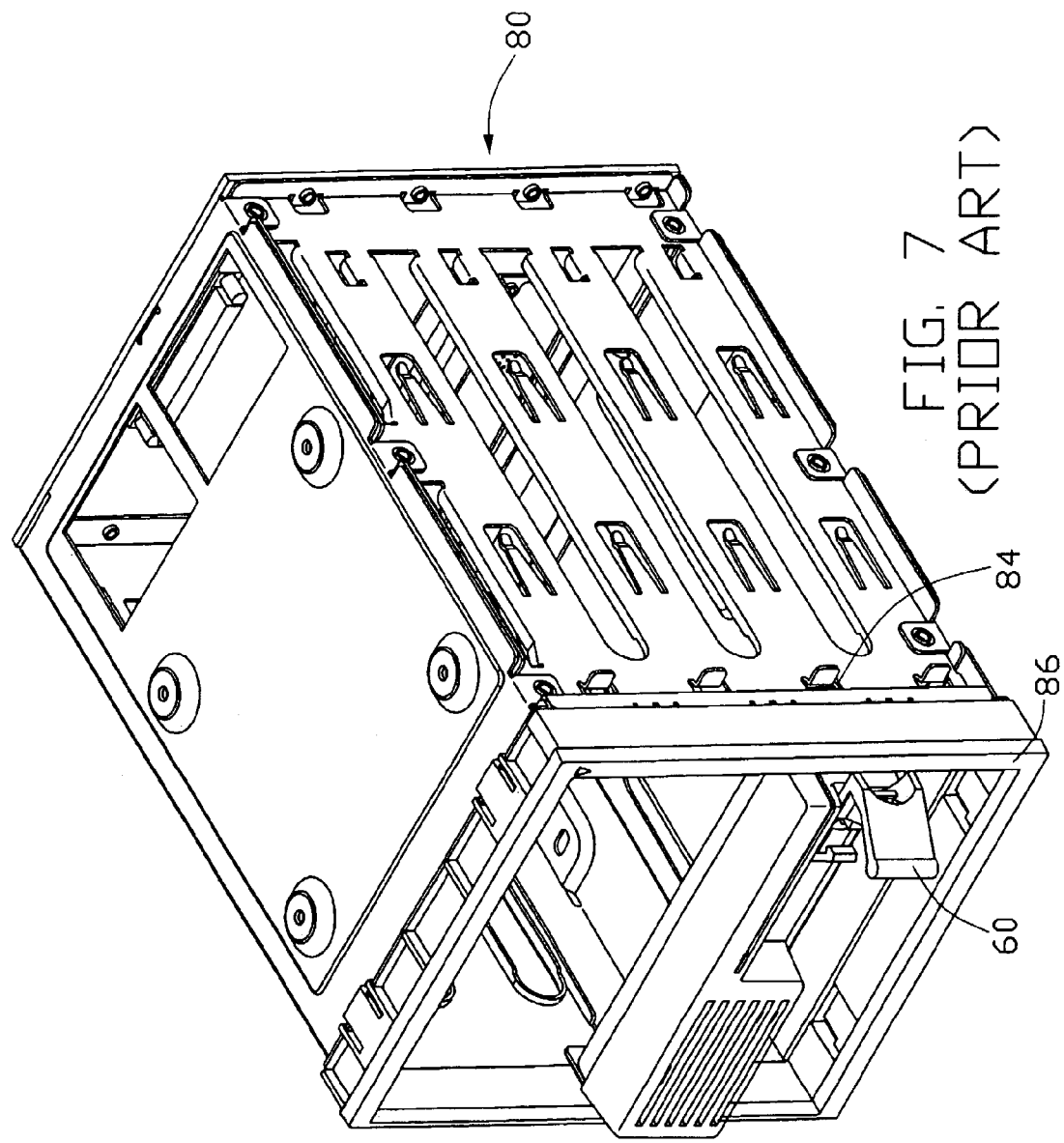
FIG. 7 is an exploded, isometric view of the carrier of FIG. 6 correctly received in a rack.
Figure 8:
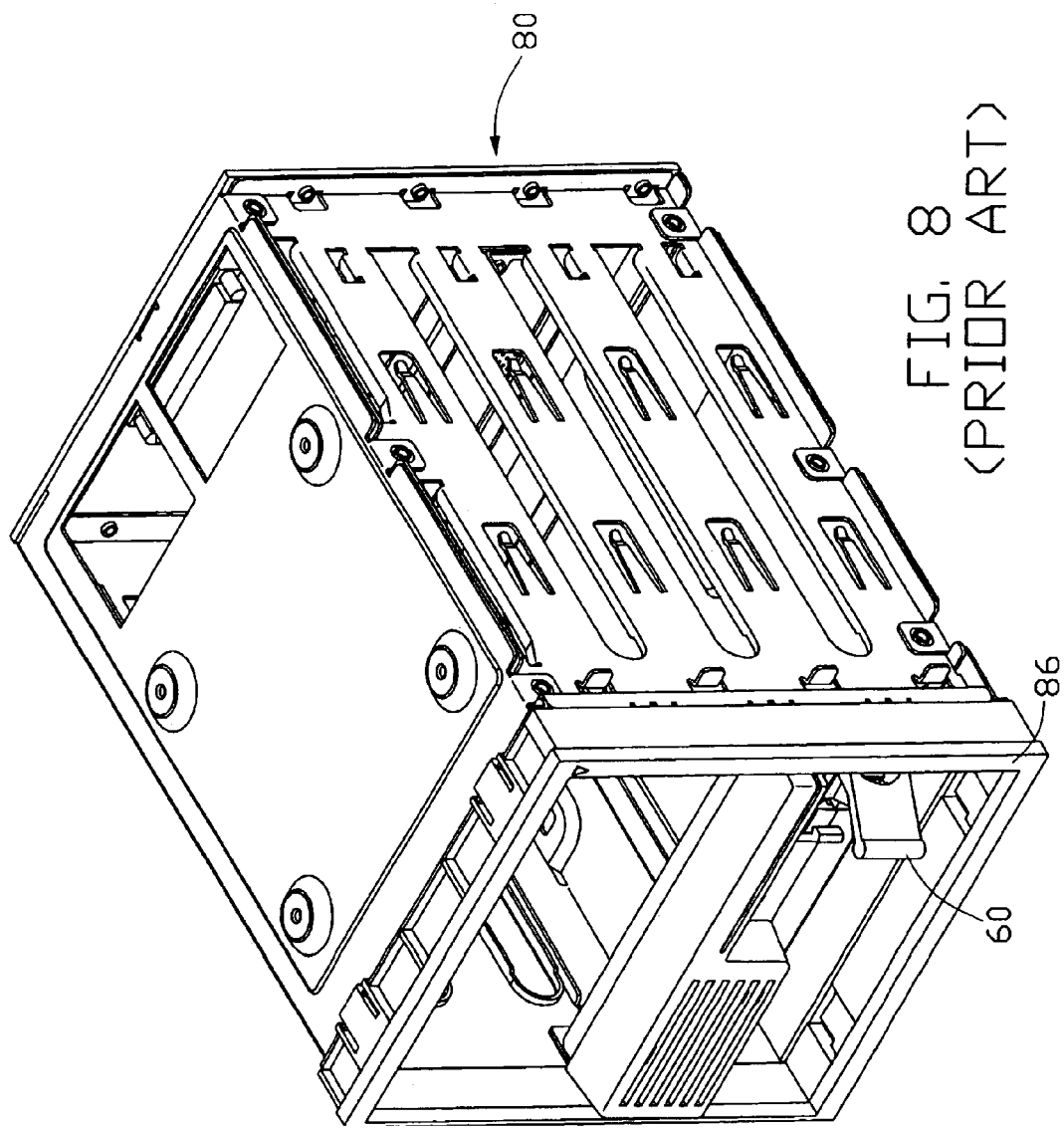
FIG. 8 is similar to FIG. 7, but showing the carrier of FIG. 6 over-inserted into and stuck in the rack.

Referring to FIGS. 4–5, a peripheral device rack 70 has a generally parallelepiped-shaped construction. The rack 70 comprises a lateral wall 72 and a front frame 76. The lateral wall 72 defines a plurality of third openings 74 therein, each third opening 74 selectably corresponding to the end portion 162 of the lever 10.

To install the carrier into the rack 70, the carrier is slidingly inserted into a selected slideway (not labeled) of the rack 70 via the front frame 76. The stop tabs 142 of the lever 10 abut the front frame 76, thereby preventing the carrier from being over-inserted into the rack 70. The handle 12 of the lever 10 is rotated in direction A (see FIG. 4). The locking arm 242 of the bezel 20 extends through the through hole 144 and snappingly engages with the catch bar 146. Simultaneously, the end portion 162 of the lever 10 extends through the second opening 342 of the drive bracket 30 and a corresponding third opening 74 of the rack 70. The lever 10 is held in equilibrium in this position, with the elongated spring 40 resiliently pulling the end portion 162, and the locking arm 242 retaining the handle 12. The carrier is thus securely received in the rack 70.

To remove the carrier out from the rack 70, the locking arm 242 of the bezel 20 is pressed so that it is released from the catch bar 146. The handle 12 is simultaneously rotated in a direction opposite to direction A. The end portion 162 of the lever 10 exits the third opening 74 of the rack 70 and the second opening 342 of the drive bracket 30. The carrier is then easily slid out from the rack 70.

It is understood that the invention may be embodied in other forms without departing from the spirit thereof. Thus, the present examples and embodiments are to be considered in all respects as illustrative and not restrictive, and the invention is not to be limited to the details given herein.

The invention claimed is:

1. A carrier for a peripheral device rack, comprising:
    a drive bracket for receiving an electronic device therein and adapted to be received in the rack, the drive bracket comprising a front plate and an adjacent side plate, said front plate and side plate respectively defining a first opening and an adjacent second opening;
    a bezel attached to the front plate of the drive bracket, the bezel defining an aperture corresponding to the first opening of the drive bracket;
    a lever comprising a handle and a main body pivotably extending through the aperture of the bezel and the first opening of the bracket, a pair of stop tabs projecting from said handle, the main body comprising an end portion, the end portion and the stop tabs located at two opposite sides of a pivot; and
    spring means attached between the drive bracket and the end portion of the lever;
    wherein when the drive bracket is slid into the rack, the stop tabs of the lever abut the rack thererby preventing the carrier from being over-inserted into the rack, and the end portion extends through the second opening of the drive bracket to engage with rack thereby securing the carrier to the rack, the spring means is elongated to pull the end portion of the lever to the drive bracket.

2. The carrier as claimed in claim 1, wherein the bezel defines a recess in a front thereof, the aperture is defined in the bezel at the recess.

3. The carrier as claimed in claim 2, wherein the recess is bounded in part by a main inner side, a pair of parallel ears extends rearwardly from the main inner side respectively at upper and lower sides of the aperture, said ears extend through the first opening of the drive bracket, and each of the ears defines a first pivot hole therein.

4. The carrier as claimed in claim 3, wherein the main body of the lever defines a second pivot hole corresponding to the first pivot holes of the bezel.

5. The carrier as claimed in claim 2, wherein a slanted locking arm extends outwardly from an edge of the main inner side at an end of the aperture.

6. The carrier as claimed in claim 5, wherein the top portion of the lever defines a through hole therein, a catch is formed adjacent the through hole, and the locking arm of the bezel extends through the through hole to engage with the catch.

7. The crier as claimed in claim 1, wherein a catch tongue is stamped from the front plate, adjacent the first opening and distal from the second opening, a protrusion is formed inside the end portion of the main body of the lever corresponding to said catch tongue, the spring is attached between said catch tongue and protrusion.

8. A mounting apparatus comprising:
    a rack comprising a front frame and a lateral wall, the lateral wall defining an opening; and
    a carrier comprising:
    a drive bracket received in the rack;
    a bezel attached to a front portion of the drive bracket, the bezel defining a recess therein and an aperture at said recess;
    a lever extending through the aperture and pivotably attached to the bezel, the lever comprising a handle and a body, the handle comprising at least one stop tab protruding therefrom; and
    spring means attached between the drive bracket and the lever;
    wherein the lever is pivotable between a first position in which the body of the lever engages in the opening of the rack and the at least one stop tab is spaced from the front frame of the rack, and a second position in which the body is released from the opening and the at least one stop tab abuts the front frame.

9. The mounting apparatus as described in claim 8, wherein the recess is bounded in part by a main inner side, a pair of parallel ears extends rearwardly from the main inner side respectively at upper and lower sides of the aperture, the ears extend through first opening of the drive bracket and each of the ears defines a first pivot hole therein.

10. The mounting apparatus as described in claim 9, wherein the body of the lever defines a second pivot hole therein corresponding to the first pivot holes of the bezel.

11. The mounting apparatus as described in claim 9, wherein a slanted locking arm extends outwardly from an edge of the main inner side of the aperture, the handle of the lever defines a through hole, a catch is formed adjacent the through hole, and the locking arm of the bezel extends through the through hole to engage with the catch in the first position.

12. The mounting apparatus as described in claim 8, wherein a catch tongue is stamped from the front plate adjacent the first opening and distal from the second opening, a protrusion is formed inside the end portion of the body of the lever, and the spring means is attached between said catch tongue and said protrusion.

* * * * *